United States Patent [19]

Todt et al.

[11] Patent Number: 5,776,864
[45] Date of Patent: Jul. 7, 1998

[54] LARGE SINGLE DOMAIN 123 MATERIAL PRODUCED BY SEEDING WITH SINGLE CRYSTAL RARE EARTH BARIUM COPPER OXIDE SINGLE CRYSTALS

[75] Inventors: Volker Todt, Lemont; Dean J. Miller, Darien, both of Ill.; Donglu Shi, Oak Park; Suvankar Sengupta, Columbus, both of Ohio

[73] Assignee: The University of Chicago, Chicago, Ill.

[21] Appl. No.: 834,687

[22] Filed: Apr. 1, 1997

Related U.S. Application Data

[63] Continuation of Ser. No. 371,931, Jan. 12, 1995, abandoned.

[51] Int. Cl.⁶ .................. H01L 39/12; C04B 35/653
[52] U.S. Cl. .................. 505/450; 505/451; 505/729; 252/521; 23/301; 423/21.1; 423/263
[58] Field of Search .................. 505/729, 450, 505/451; 252/578, 521; 23/301; 423/401, 263

[56] References Cited

U.S. PATENT DOCUMENTS

| | | | |
|---|---|---|---|
| 4,939,120 | 7/1990 | Moon et al. | 505/1 |
| 4,956,336 | 9/1990 | Salama et al. | 505/1 |
| 5,011,823 | 4/1991 | Jin et al. | 505/1 |
| 5,084,436 | 1/1992 | Morimoto et al. | 505/1 |
| 5,231,076 | 7/1993 | Jeong et al. | 505/1 |
| 5,292,716 | 3/1994 | Sakai et al. | 505/1 |
| 5,308,799 | 5/1994 | Morita et al. | 505/126 |
| 5,409,892 | 4/1995 | Hayashi et al. | 505/451 |

FOREIGN PATENT DOCUMENTS 5-170598  7/1993  Japan.

OTHER PUBLICATIONS

Critical Current Densities in Superconducting Y–B–Cu–O Prepared by the Quench–and–Melt Growth Technique, Japanese Journal of Applied Physics, vol. 28, No. 9, Sep. 1989,L.1545.

Superconductivity of $YBa_2Cu_3O_{7x}$ by Addition of Reactive Fine Powders, Vo.30 No. 2. Feb. 1991, pp. 245–250, Sakai et al. J.J.A.P.

Todt et al "Processing of Large $YBa_2Cu_3O_x$ Domains for Levitation Applications . . . " Journal of Electronic Materials, vol. 23, No. 11, Nov. 1994, pp. 1127–1130.

*Primary Examiner*—Paul Lieberman
*Assistant Examiner*—M. Kopec
*Attorney, Agent, or Firm*—Emrich & Dithmar

[57] ABSTRACT

A method of fabricating bulk $YBa_2Cu_3O_x$ where compressed powder oxides and/or carbonates of Y and Ba and Cu present in mole ratios to form $YBa_2Cu_3O_x$ are heated in the presence of a $Nd_{1+x}Ba_{2-x}Cu_3O_y$ seed crystal to a temperature sufficient to form a liquid phase in the $YBa_2Cu_3O_x$ while maintaining the seed crystal solid. The materials are slowly cooled to provide a $YBa_2Cu_3O_x$ material having a predetermined number of domains between 1 and 5. Crack-free single domain materials can be formed using either plate shaped seed crystals or cube shaped seed crystals with a pedestal of preferential orientation material.

22 Claims, 4 Drawing Sheets

5,776,864

LARGE SINGLE DOMAIN 123 MATERIAL PRODUCED BY SEEDING WITH SINGLE CRYSTAL RARE EARTH BARIUM COPPER OXIDE SINGLE CRYSTALS

This is a continuation of application Ser. No. 08/371,931, filed Jan. 12, 1995 now ABN.

CONTRACTUAL ORIGIN OF THE INVENTION

The United States Government has rights in this invention pursuant to Contract No. W-31-109-ENG-38 between the U.S. Department of Energy and The University of Chicago representing Argonne National Laboratory.

BACKGROUND OF THE INVENTION

This invention relates to a method of preparing large multiple and single domain $YBa_2Cu_3O_x$ material (123 material). More specifically, the invention relates to an improved seeding method for preparing large single domain as well as large multiple domain $YBa_2Cu_3O_x$ materials, each with improved levitation properties.

Large domains of $YBa_2Cu_3O_x$ materials show high levitation forces because of their size and because of their good flux-pinning strength due to large numbers of small pinning sites. The materials show promise in practical applications requiring levitation, such as fly wheels for energy storage, high field magnets, magnetic resonance imaging and efficient generators. Previously, $SmBa_2Cu_3O_x$ had been used as the seeding material during the melt-growth process in making large single domain 123 material ($YBa_2Cu_3O_x$). More particularly, $SmBa_2Cu_3O_x$ (Sm 123) had been used, but this material has a serious defect in that Sm 123 has only a slightly higher melting point than the bulk 123 material and, therefore, the seeds of Sm 123 often melt during the process, which is undesirable since the purpose of the seeding material is to provide solid particles to facilitate the crystallization of the melted 123 material. Previously, it has been thought that Nd 123 which forms a solid solution range in the form $Nd_{1+x}Ba_{2-x}Cu_3O_y$, wherein x is in the range of from 0.0 to 0.5, was unsatisfactory to use as a seed material, but it has unexpectedly found that because Nd123 forms such a solid solution it can be used as superior seeding material to form large domain material. Reason for this is the high melting point and the unique seeding properties.

SUMMARY OF THE INVENTION

Accordingly, an object of the present invention is to provide a method of making large single domain 123 material by the use of Nd seeding materials.

Another object of the invention is to provide a method of making multiple domain material using Nd seeding materials.

Yet another object of the invention is to provide a method of making large single domain crack free 123 material using Nd as a seeding material.

The invention consists of certain novel features and a combination of parts hereinafter fully described, illustrated in the accompanying drawings, and particularly pointed out in the appended claims, it being understood that various changes in the details may be made without departing from the spirit, or sacrificing any of the advantages of the present invention.

BRIEF DESCRIPTION OF THE DRAWINGS

For the purpose of facilitating an understanding of the invention, there is illustrated in the accompanying drawings a preferred embodiment thereof, from an inspection of which, when considered in connection with the following description, the invention, its construction and operation, and many of its advantages should be readily understood and appreciated.

DESCRIPTION OF THE PREFERRED EMBODIMENT

Figure 1:
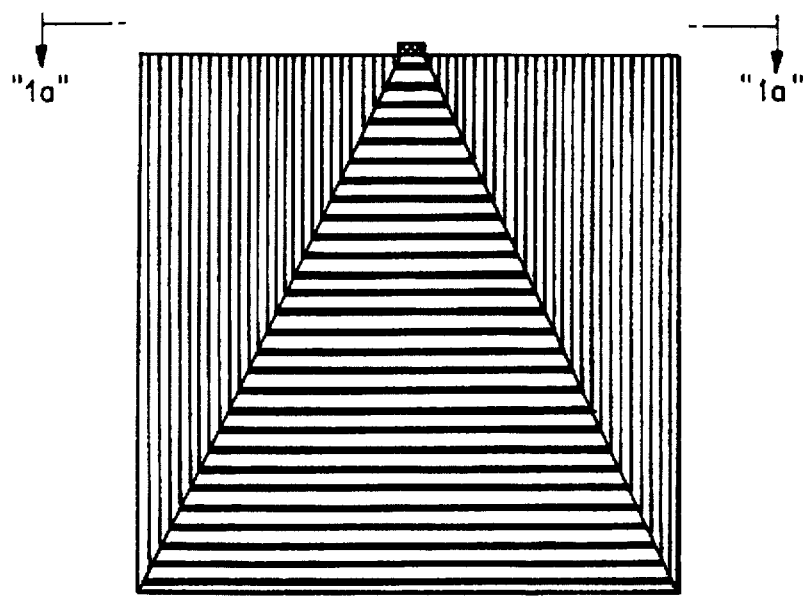
FIG. 1 is a view of a multiple domain material using a cube shape seed material in direct contact with the bulk 123 material.
Figure 1A:
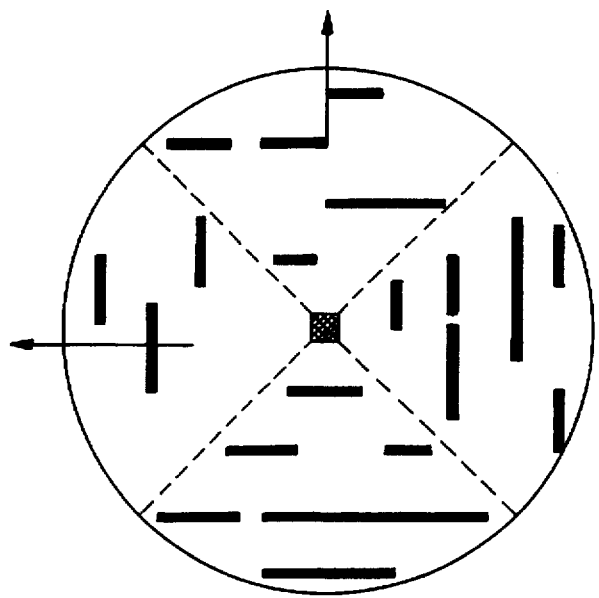

Previously, it has been understood that 123 material has superior critical current density $J_c$ and high $T_c$ properties if a mixture of 211 ($Y_2BaCuO_5$) is precipitated throughout the 123 material. Traditionally, enhanced flux pinning in bulk 123 material has been obtained by providing precipitated 211 material distributed throughout the 123 material by heating the 123 components to a temperature just below 1200° C. to form a mixture of 211 plus a liquid (211+L) and subsequent slow cooling of the product. This technique is often associated with formation of larger 211 precipitates having particle diameters in the order of 5–30 microns if a platinum crucible is not used, since at elevated temperatures the Pt crucible interacts with the materials to produce finer 211 precipitates on the order of 0.01 to 1 micron. When larger 211 particles precipitate, the resultant 123 material has reduced flux pinning as well as other properties such as lower $J_c$.

The prior art method is called quench-melt growth (QMG) method and has been shown to be an effective way of making 123 superconductors with strong pinning strength. However, one of the characteristics of the conventional QMG method is that it relies upon the reaction of the molten liquid with a platinum crucible to generate fine 211 precipitates. If a platinum crucible is not used, large precipitates result in spite of quenching. In addition, the subsequent quenching processing, which is the key part of QMG, can be difficult to control, making systematic studies difficult. In order to develop various microstructures consistently, using low processing temperature and avoiding the quenching procedure are highly desirable. An alternative method was used to obtain a microstructure that is similar to that obtained with QMG and provided enhanced flux pinning from fine 211 precipitates.

In the QMG process, the sintered sample is generally located to the $Y_2O_3$ plus liquid phase region (>1200° C.) and then splat-quenched using copper plates. The resulting sample then consists of $Y_2O_3$ particles and solidified liquid phase (a mixture of barium cuprates and amorphous phases). For improved homogeneity the quenched sample is crushed into fine powder and pressed into the desired shape (the so-called Melt Powder Growth Method). The pressed sample is then heated to the 211 plus liquid phase region and cooled slowly through the peritectic point. In the QMG method, the liquid phase is produced prior to quenching by heating the 123 phase above 1200° C. to the $Y_2O_3$+L phase region.

To avoid this high-temperature melting and subsequent quenching, a method was used to obtain the solidified liquid of composition L through a solid-state route. This method is the solid-liquid-melt growth (SLMG) process to distinguish it from the related process of QMG and the "powder melt process" (PMP) of Zhou Lian and co-workers. Specifically, the SLMG method requires mixing $BaCuO_2$ and $CuO$ with the composition L. $Y_2O_3$ was then added to this mixture to give a 123 overall composition. The PMP process, always employs $Y_2BaCuO_5$, $BaCuO_2$ and $CuO$ as the starting materials, while it is the $Y_2O_3$ instead of $Y_2BaCuO_5$ that is used with $BaCuO_2$ and $CuO$ in SLMG method. In SLMG processing a mixture of powders of $Y_2O_3$, $BaCuO_2$, and $CuO$ were used as a precursor which was ball-milled for 24 hours to achieve a homogenous mixture. The resulting powder was then pressed into pellets, heated to a temperature of 1030°–1050° C. at a rate of 100° C./hour, and then cooled slowly through the peritectic reaction temperature at a rate of 1° C./hour. The amount of the 211 phase was controlled by changing the amount of $Y_2O_3$, $BaCuO_2$ and $CuO$ in the starting mixture, but the preferred ratio of 123 to 211 is about 5:1.

The 211 precipitates in the SLMG samples are mostly of the size of 5–15 μm. It is unclear in the present which part of 211 in the final microstructure forms during processing and which part is a residual from the starting powders. Differential thermal analysis showed a sharp endotherm at 1010° C., indicating some 123 formed during heating. However, some of the 211 must have also formed during heating. If this sample was solely 123 prior to passing through the peritectic temperature (1010° C.) one would expect to see the same textured microstructure (i.e. with coarser 211, etc.) as is produced by conventional melt texturing of pure 123. The 123/211 mixture sample, on the other hand shows nearly uniform dispersion of 211 precipitates on the order of 1 μm. This microstructure is similar to that obtained with the QMG method. It has been well established that the size and distribution of 211 is closely associated with the initial size and mixing of the $Y_2O_3$. Thus, the SLMG method can produce a microstructure similar to that obtained by the QMG process but without undesirable high temperature melting and quenching.

Seeding material used in the present invention is a $REBa_2Cu_3O_x$ material (RE 123). The seeding material preferably is one using either Sm123 or Nd123 with Nd being preferred, notwithstanding the fact that it forms a solid solution unlike Sm and certain other rare earths. Nd123 has a higher melting point than Sm123 by about 15° C. which surprisingly, is critical to the success of the present invention. It is believed that certain combinations of Sm and Nd may be used in a satisfactory manner. However, the use of the solid solution $Nd_{1+x}Ba_{2-x}Cu_3O_y$, wherein x is in the range of from 0.0 to 0.5, wherein y is between 6 and 7, permits the use of a temperature gradient in the furnace of up to about 30° C./cm, which if parallel to the C axis of the domain material supports and enhances the directional solidification of the 123 material.

Single crystals of the seed material may be produced and harvested by providing oxide or carbonate sources of the rare earth barium and copper in quantities for the RE $Ba_2Cu_3O_x$ seed crystal. However, barium and copper is preferably present in excess of that required for the final crystals. The amount of excess barium and copper provided will determine, to a large extent, the final geometry and properties of the crystal.

The oxides and/or carbonates are ground and calcined to form powders which are thereafter heated to a temperature in excess of about 1000° C. and more particularly to a temperature of about 1100° C. to form a molten flux which is rich in both barium and copper. The molten flux is slowly cooled at a range of from about 1° c./hr to about 10° C. per hour until single crystals of the RE $Ba_2Cu_3O_x$ are formed along with flux material. Thereafter, the mixture of single crystals $REBa_2Cu_3O_x$ and flux is quenched from about 1020° C. to 970° C. and then transferred onto a porous substrate which may be, for instance magnesium oxide or 211 material, which is by its nature porous, and is then again heated to a temperature above the melting point of the flux which is about 950° C. but below the melting point of the crystals which in the case of $Nd_{1+x}Ba_{2-x}Cu_3O_y$ is 1070° C. in the presence of a porous material which is unreactive with the seed crystal in order to wick away the flux leaving the crystals more readily available for recovery. $Nd_{1+x}Ba_{2-x}Cu_3O_y$ has been prepared as above by a procedure in which the powders were calcined for a time of not less than about 24 hrs at a temperature below 1000° C. and thereafter heated to a temperature of about 1050° C. to less than 1070° C., the melting point of the Nd seed for not less than 24 hrs and subsequently heated to a temperature to about 1100° C. and then cooled at a rate in the range of between 1° C. per hour to about 10° C. per hour. Holding superconductor materials such as $Nd_{1+x}Ba_{2-x}Cu_3O_y$ at temperatures above the peritectic temperature for a time between about one-half hour to in excess of 80 hours is well established in the art and makes little if any difference to the microstructure of the final material. Thereafter, the mixture of single crystals and flux were heated to a temperature in the range of from about 870° C. to about 1050° in the presence of a porous material unreactive to the rare earth seed crystal in order to wick away the flux leaving the crystals available for easy separation and recovery. As before stated, barium and copper are present in excess so that the mole ratio of Nd to Ba to Cu is in the range of from about 1:2:15 to about 1:6:3 and preferably about 1:3:10. Further, the unreactive porous wicking material should have an open porosity with substantial connection between the pores as it obtained by using 211 material.

The seed material formed can be either cubic or plate like in shape depending on the excess amount of flux used. Using two times the excess amount of flux will produce plate-like seed crystals, while using less flux to produce cubic shaped crystals.

Unexpectedly, it has been found that using the Nd seed material previously described, large domain material can be fabricated in which the number of domains is controllable between one and five. For reasons not yet understood, plate-like seed crystals will produce the single domain material while cube like seed crystals will produce a multiple domain material having as many as five domains. Bulk-single domain materials having diameters in the range of from between about 2 cm to about 3 cm and between 3 and 3.5 cm tall have been made using the process of the present invention.

When multiple domain material is produced with the method of the present invention, cracks occur and it is believed that these cracks may be responsible for weak mechanical properties and for the large differences in magnetic properties between various samples. The invention includes providing a preferential growth material intermediate the seed crystal and the bulk 123 material which results in production of a crack-free single domain 123 material. Where a material with multiple domains is preferred, the method of the present invention provides such a material in addition to the single domain crack free material. The preferential growth material which may be 123 or mixtures of 123 and 211 and $PtO_2$ and as used herein may be cylindrical or tubular in geometric configuration and should be of sufficient length so that single domain material is produced in the bulk 123 material. The seed crystal is simply laid on top of the preferential growth material and depending upon the size of the seed material, the length of the preferential growth material has to be selected to provide single domain material in the bulk 123 material.

Figure 2:
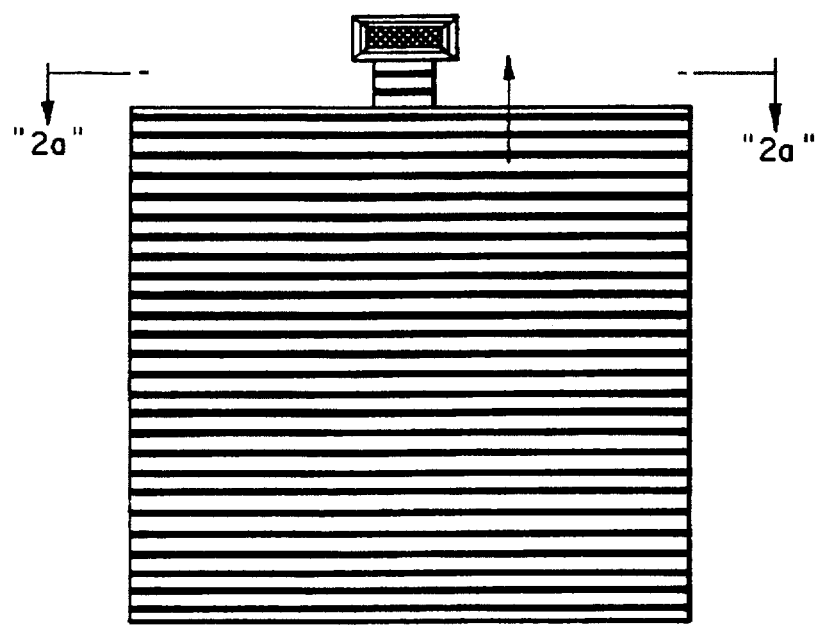
FIG. 2 is a view like FIG. 1 wherein the preferential growth cylinder is of a smaller diameter than the cube shape seed material.
Figure 2A:
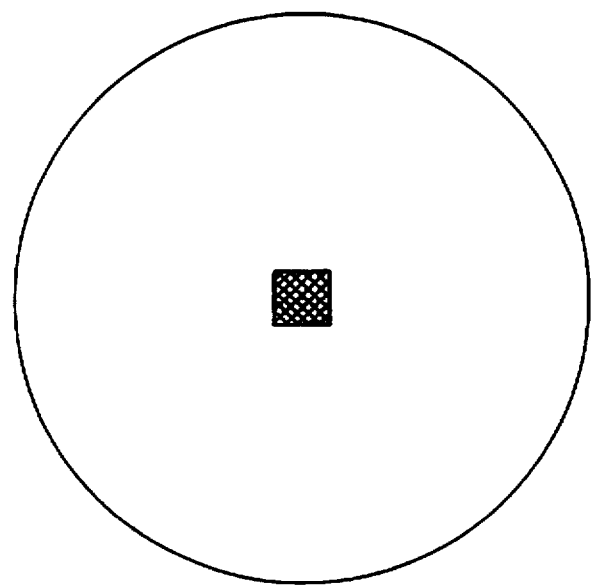
Figure 3:
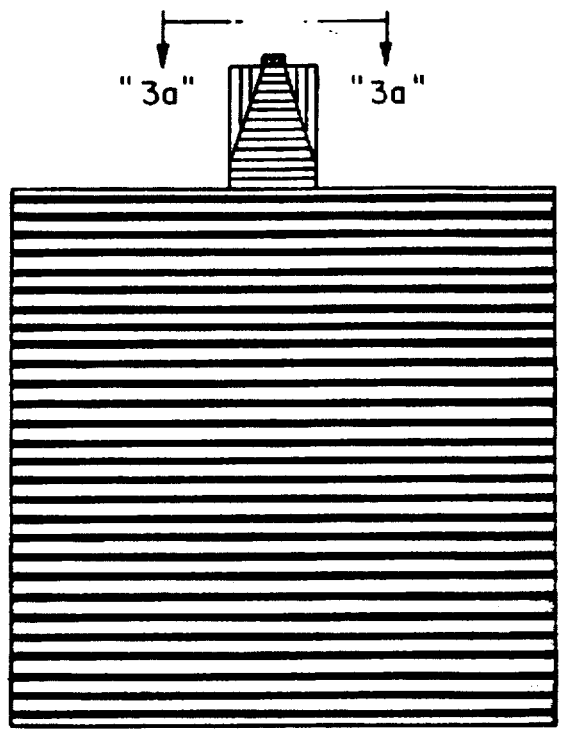
FIG. 3 is an elevational view of a single domain material showing a generally cubic seed material and a preferential growth cylinder.
Figure 3A:
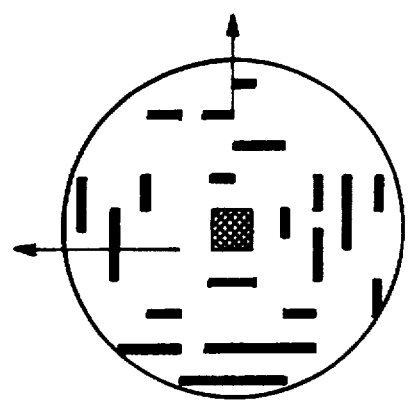

Referring now to the drawings, there is disclosed in FIGS. 1–3, representations of multiple domain material in FIG. 1 and single domain materials in FIGS. 2 and 3 wherein the seed crystal dimensions exceed that of the preferential growth material in FIG. 2 and the seed material dimensions are less than the diameter of the preferential growth material in FIG. 3. As can be seen from FIGS. 2 and 3 and particularly from the insets thereof, each of these large domain materials are crack free with the a-b axes of the material parallel, increasing the ability to cleave the domains along the a-b planes producing materials of desired thickness and reducing the mechanical handling of the material previously required when the material needed to be cut with diamond tools. For instance, in FIG. 2 in which the seed crystal is larger than the cross section of the preferential growth pedestal, the pedestal height is at least 10–20% of the longitudinal extent of the seed crystal. In FIG. 3, in which the pedestal cross sectional area is greater than the longitudinal extent of the seed crystal, the longitudinal extend of the pedestal height is at least 50% as large as the difference between the pedestal cross sectional area and the longitudinal extent of the seed crystal. This is sufficient that growth of more than one domain ceases before the bulk 123 material crystallizes resulting in a single crack free domain with parallel a-b axes capable of being cleaved rather than cut and with the c-axis vertically oriented.

Figure 4:
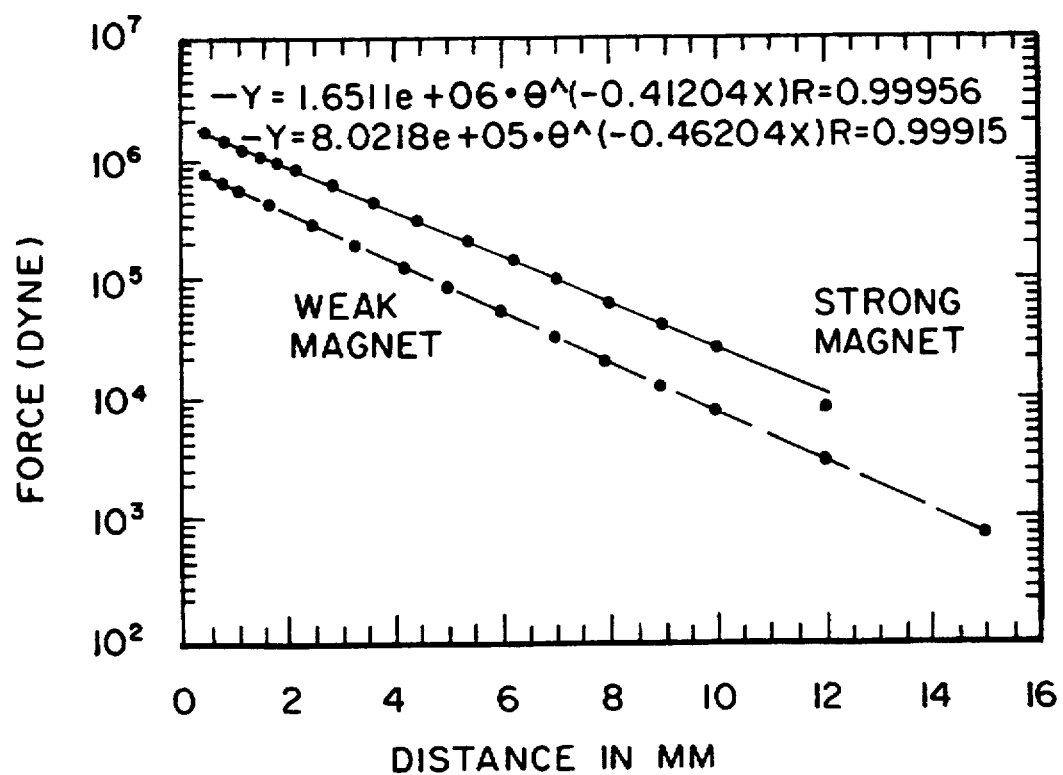
FIG. 4 is a graphical representation of the relationship of levitation force and distance for materials made in accordance with the present invention.

Referring to FIG. 4, there is illustrated a graphical representation of the levitation force of single domain material which is crack free compared to multiple domain material which contains cracks. More specifically, FIG. 4 shows the difference in levitation force for crack-free single domain material (top curve) and material in which there are multiple domains with cracks (lower curve).

While there has been disclosed what is considered to be the preferred embodiment of the present invention, it is understood that various changes in the details may be made without departing from the spirit, or sacrificing any of the advantages of the present invention.

The embodiments of the invention in which an exclusive property or privilege is claimed are defined as follows:

1. A method of fabricating bulk $YBa_2Cu_3O_x$ comprising heating compressed powder oxides and/or carbonates of Y and Ba and Cu present in mole ratios to form $YBa_2Cu_3O_x$ in the presence of a $Nd_{1+x}Ba_{2-x}Cu_3O_y$ seed crystal to a temperature sufficient to form a liquid phase in the $YBa_2Cu_3O_x$ while maintaining the seed crystal solid and thereafter cooling to provide a $YBa_2Cu_3O_x$ material having a predetermined number of domains between 1 and 5.

2. The method of claim 1, wherein the heating and/or the cooling includes providing a temperature gradient of up to about 30° c./cm parallel to a longitudinal axis of the $YBa_2Cu_3O_x$ material.

3. The method of claim 2, wherein the bulk $YBa_2Cu_3O_x$ has up to 25% by weight $YBa_2Cu_3O_x$ and up to about 1% by weight $PtO_2$.

4. The method of claim 3, wherein the seed crystal is cube shaped.

5. The method of claim 3, wherein the seed crystal is plate shaped.

6. The method of claim 3, wherein the compressed powder is heated to a temperature not greater than about 1070° C.

7. A method of fabricating crack-free single-domain $YBa_2Cu_3O_x$ materials, comprising interposing a preferential growth material between and in contact with powders of the oxides and/or carbonates of Y, Ba and Cu present in mole ratios to form $YBa_2Cu_3O_x$ and a cube-shaped seed crystal essentially of $Nd_{1+x}Ba_{2-x}Cu_3O_y$, heating to a temperature sufficient to form a liquid phase in the $YBa_2Cu_3O_x$ material while maintaining the $Nd_{1+x}Ba_{2-x}Cu_3O_y$ seed crystal solid, and thereafter cooling to produce a crack-free single-domain $YBa_2Cu_3O_x$ material.

8. The method of claim 7, wherein the seed crystal is solely $Nd_{1+x}Ba_{2-x}Cu_3O_y$.

9. The method of claim 7, wherein the bulk $YBa_2Cu_3O_x$ is doped with $PtO_2$.

10. The method of claim 7, wherein the bulk $YBa_2Cu_3O_x$ prior to heating includes up to about 25% by weight of $Y_2BaCuO_x$ and up to about 1% by weight $PtO_2$ and is unsintered.

11. The method of claim 7, wherein the preferential growth material is generally cylindrical and includes $YBa_2Cu_3O_x$.

12. The method of claim 10, wherein the seed crystal is cube-shaped $Nd_{1+x}Ba_{2-x}Cu_3O_y$ smaller than the transverse cross-sectional area of the preferential growth material, the preferential growth material having a longitudinal extent sufficient to ensure a single domain in the bulk $YBa_2Cu_3O_x$.

13. The method of claim 10, wherein the seed crystal is $Nd_{1+x}Ba_{2-x}Cu_3O_y$ larger than the cross-sectional area of the preferential growth material, the preferential growth material cylinder having a longitudinal extant sufficient to ensure a single domain in the $YBa_2Cu_3O_x$.

14. The method of claim 7, wherein a temperature gradient in the range of from 10° C./cm to about 30° C./cm is applied to a longitudinal axis of the $YBa_2Cu_3O_x$ during heating and/or cooling.

15. The method of claim 7, wherein a temperature gradient of up to 30° C./cm is applied to the $YBa_2Cu_3O_x$ material during heating and/or cooling in a direction parallel to the C-axis.

16. A method of fabricating crack-free single domain $YBa_2Cu_3O_x$ material, comprising contacting powders of the oxides and/or carbonates of Y, Ba and Cu present in mole ratios to form $YBa_2Cu_3O_x$ with a plate-shaped $Nd_{1+x}Ba_{2-x}Cu_3O_y$ seed crystal, heating to a temperature sufficient to form a liquid phase in the $YBa_2Cu_3Ox$ material while maintaining the $Nd_{1+x}Ba_{2-x}Cu_3O_y$ seed crystal solid, and thereafter cooling to produce a crack-free single-domain $YBa_2Cu_3O_x$ material.

17. The method of claim 16, wherein the single domain material includes up to about 25% by weight $YBa_2Cu_3O_x$ and up to about 1% by weight $PtO_2$.

18. A method of fabricating multiple domain $YBa_2Cu_3O_x$ materials, comprising contacting a cube-shaped $Nd_{1+x}Ba_{2-x}Cu_3O_y$ seed crystal with compressed powders of the oxides and/or carbonates of Y, Ba and Cu present in mole ratios to form $YBa_2Cu_3O_x$ material, heating to a temperature sufficient to form a liquid phase in the $YBa_2Cu_3O_x$ material while maintaining the seed crystals solid, and thereafter cooling to produce a multiple domain $YBa_2Cu_3O_x$ material.

19. The method of claim 18, wherein the material has up to 5 domains.

20. The method of claim 19, wherein the multiple domain $YBa_2Cu_3O_x$ material contains up to 25% by weight $Y_2BaCuO_x$ and up to about 1% by weight $PtO_2$.

21. The method of claim 20, wherein a temperature gradient is applied during heating and/or cooling in the range of from 10° C./cm to about 30° C./cm along a longitudinal axis of the $YBa_2Cu_3O_x$ material.

22. A method of fabricating crack-free single-domain $YBa_2Cu_3O_x$ materials, comprising interposing a preferential growth material between and in contact with powders of the oxides and/or carbonates of Y, Ba and Cu present in mole ratios to form $YBa_2Cu_3O_x$ and a cube-shaped seed crystal essentially of $RE_{1+x}Ba_{2-x}Cu_3O_y$, heating to a temperature sufficient to form a liquid phase in the $YBa_2Cu_3O_x$ material while maintaining the $RE_{1+x}Ba_{2-x}Cu_3O_y$ seed crystal solid, and thereafter cooling to produce a crack-free single-domain $YBa_2Cu_3O_x$ material, wherein RE of the seed crystal is Nd or a mixture of Nd and Sm.

* * * * *

UNITED STATES PATENT AND TRADEMARK OFFICE
CERTIFICATE OF CORRECTION

PATENT NO. : 5,776,864
DATED : July 7, 1998
INVENTOR(S) : Volker Todt, et al.

It is certified that error appears in the above-indentified patent and that said Letters Patent is hereby corrected as shown below:

Claim 16, line 48, delete "$YBa_2Cu_3Ox$" and insert --$YBa_2Cu_3O_x$--.

Signed and Sealed this

Tenth Day of April, 2001

*Attest:*

NICHOLAS P. GODICI

*Attesting Officer*     *Acting Director of the United States Patent and Trademark Office*